US011699383B2

(12) United States Patent
Martin et al.

(10) Patent No.: US 11,699,383 B2
(45) Date of Patent: Jul. 11, 2023

(54) DISPLAY PIXELS WITH INTEGRATED PIPELINE

(71) Applicant: Tectus Corporation, Saratoga, CA (US)

(72) Inventors: Paul Scott Martin, Palo Alto, CA (US); Naamah Argaman, San Jose, CA (US); Michael West Wiemer, San Jose, CA (US)

(73) Assignee: Tectus Corporation, Saratoga, CA (US)

( * ) Notice: Subject to any disclaimer, the term of this patent is extended or adjusted under 35 U.S.C. 154(b) by 0 days.

(21) Appl. No.: 17/836,966

(22) Filed: Jun. 9, 2022

(65) Prior Publication Data

US 2022/0392395 A1 Dec. 8, 2022

Related U.S. Application Data

(63) Continuation of application No. PCT/US2022/031999, filed on Jun. 2, 2022.
(Continued)

(51) Int. Cl.
*G09G 3/32* (2016.01)
*G09G 3/20* (2006.01)
(Continued)

(52) U.S. Cl.
CPC ............ *G09G 3/2096* (2013.01); *G09G 3/32* (2013.01); *H01L 25/0652* (2013.01); *H01L 25/18* (2013.01); *H01L 25/50* (2013.01); *G09G 2300/0408* (2013.01); *G09G 2300/0452* (2013.01); *G09G 2320/041* (2013.01); *G09G 2320/0666* (2013.01); *G09G 2320/0693* (2013.01); *H01L 21/78* (2013.01); (Continued)

(58) Field of Classification Search
CPC .................. G09G 3/2096; G09G 3/32; G09G 2300/0408; G09G 2300/0452; G09G 2320/041; G09G 2320/0666; G09G 2320/0693; H01L 25/0652; H01L 25/18; H01L 25/50; H01L 21/78; H01L 24/08; H01L 24/29; H01L 24/32; H01L 24/33; H01L 24/94; H01L 27/15; H01L 2224/08145; H01L 2224/2919; H01L 2224/32237; H01L 2224/33181; H01L 2224/94; H01L 2924/14253; H01L 2924/1431; H01L 2924/1437; H01L 25/167; H01L 25/0753; H01L 33/0095; H01L 33/32; H01L 33/50
See application file for complete search history.

(56) References Cited

U.S. PATENT DOCUMENTS 8,848,792 B2 * 9/2014 Macinnis ......... H04N 21/42653
375/240.15
9,153,171 B2 * 10/2015 Sakariya ............... G09G 3/3233
(Continued)

Primary Examiner — Vijay Shankar
(74) Attorney, Agent, or Firm — Fenwick & West LLP

(57) ABSTRACT

A display is created using "smart pixels." A smart pixel is a pixel of a display that integrates the pixel pipeline as part of the pixel, rather than using separate integrated circuits. A smart pixel may be based on an integrated stack that includes light emitting elements, an external data contact for receiving digital data for that pixel, and also the pixel pipeline from the digital data to the light emitting elements.

23 Claims, 11 Drawing Sheets

Related U.S. Application Data

(60) Provisional application No. 63/197,042, filed on Jun. 4, 2021.

(51) Int. Cl.
    *H01L 25/065*     (2023.01)
    *H01L 25/18*     (2023.01)
    *H01L 25/00*     (2006.01)
    *H01L 27/15*     (2006.01)
    *H01L 23/00*     (2006.01)
    *H01L 21/78*     (2006.01)

(52) U.S. Cl.
    CPC .............. *H01L 24/08* (2013.01); *H01L 24/29* (2013.01); *H01L 24/32* (2013.01); *H01L 24/33* (2013.01); *H01L 24/94* (2013.01); *H01L 27/15* (2013.01); *H01L 2224/08145* (2013.01); *H01L 2224/2919* (2013.01); *H01L 2224/32237* (2013.01); *H01L 2224/33181* (2013.01); *H01L 2224/94* (2013.01); *H01L 2924/1431* (2013.01); *H01L 2924/1437* (2013.01); *H01L 2924/14253* (2013.01)

(56) References Cited

U.S. PATENT DOCUMENTS

| | | |
|---|---|---|
| 9,865,577 B2 | 1/2018 | Bibl |
| 10,134,325 B2 | 11/2018 | Chaji |
| 10,411,210 B2 | 9/2019 | Bibl |
| 10,446,719 B2 | 10/2019 | Bower |
| 10,636,351 B2 | 4/2020 | Cobb |
| 10,796,648 B2 | 10/2020 | Sakariya |
| 10,923,023 B1 | 2/2021 | Bibl |
| 10,991,845 B2 | 4/2021 | Plössl |
| 11,031,380 B2 | 6/2021 | Wong |
| 11,056,472 B2 | 7/2021 | Kim |
| 11,177,248 B2 | 11/2021 | Schwarz |
| 11,295,680 B2 * | 4/2022 | Wyatt ..................... H01L 27/15 |
| 2014/0168037 A1 | 6/2014 | Sakariya |
| 2018/0247922 A1 | 8/2018 | Robin |
| 2020/0403028 A1 * | 12/2020 | Kusunoki ............. H01L 33/505 |
| 2021/0005845 A1 * | 1/2021 | Kim ....................... G06F 3/0412 |
| 2021/0097943 A1 * | 4/2021 | Wyatt .................. H10K 59/351 |
| 2021/0193639 A1 | 6/2021 | Robin |
| 2022/0398987 A1 * | 12/2022 | Wyatt ................. H01L 25/0753 |

* cited by examiner

DISPLAY PIXELS WITH INTEGRATED PIPELINE

CROSS-REFERENCE TO RELATED APPLICATION(S)

This application is a continuation of International Application No. PCT/US2022/031999, "Display Pixels with Integrated Pipeline," filed on Jun. 2, 2022; which claims priority to U.S. Provisional Patent Application Ser. No. 63/197,042, "Smart Pixels," filed Jun. 4, 2021. The subject matter of all of the foregoing is incorporated herein by reference in their entirety.

BACKGROUND

1. Technical Field

This disclosure relates generally to displays.

2. Description of Related Art

The worldwide appetite for displays is insatiable. One widely used class of displays is based on arrays of light emitting diodes (LEDs). The original digital image to be displayed by the LEDs is represented by an array of pixel values, for example using an RGB, YUV or other format for the color and intensity of each pixel in the image. This digital data is an array of numbers, which is converted to the corresponding drive currents/voltages for the LEDs.

For convenience, the circuitry, firmware, and/or software that perform this conversion may be referred to as the pixel pipeline. In conventional LED displays, the pixel pipelines for the entire array of pixels is typically implemented using a set of integrated circuits that carry out different functions in the pipeline. The die containing the LED array then receives the drive signals produced by this set of integrated circuits.

In some cases, the LED array may be bonded to an array of driver circuits. The LED array may be referred to as the frontplane and the driver circuits as the backplane. The backplane may then receive its inputs from the rest of the integrated circuits, through interconnects to the backplane. In many of these designs, because the connected LEDs and drivers are arrays with not much space between adjacent pixels, the interconnects to the drivers may be made through the exposed top or bottom surfaces of the die.

BRIEF DESCRIPTION OF THE DRAWINGS

Embodiments of the disclosure have other advantages and features which will be more readily apparent from the following detailed description and the appended claims, when taken in conjunction with the examples in the accompanying drawings, in which:

DETAILED DESCRIPTION OF THE PREFERRED EMBODIMENTS

Figure 1A:
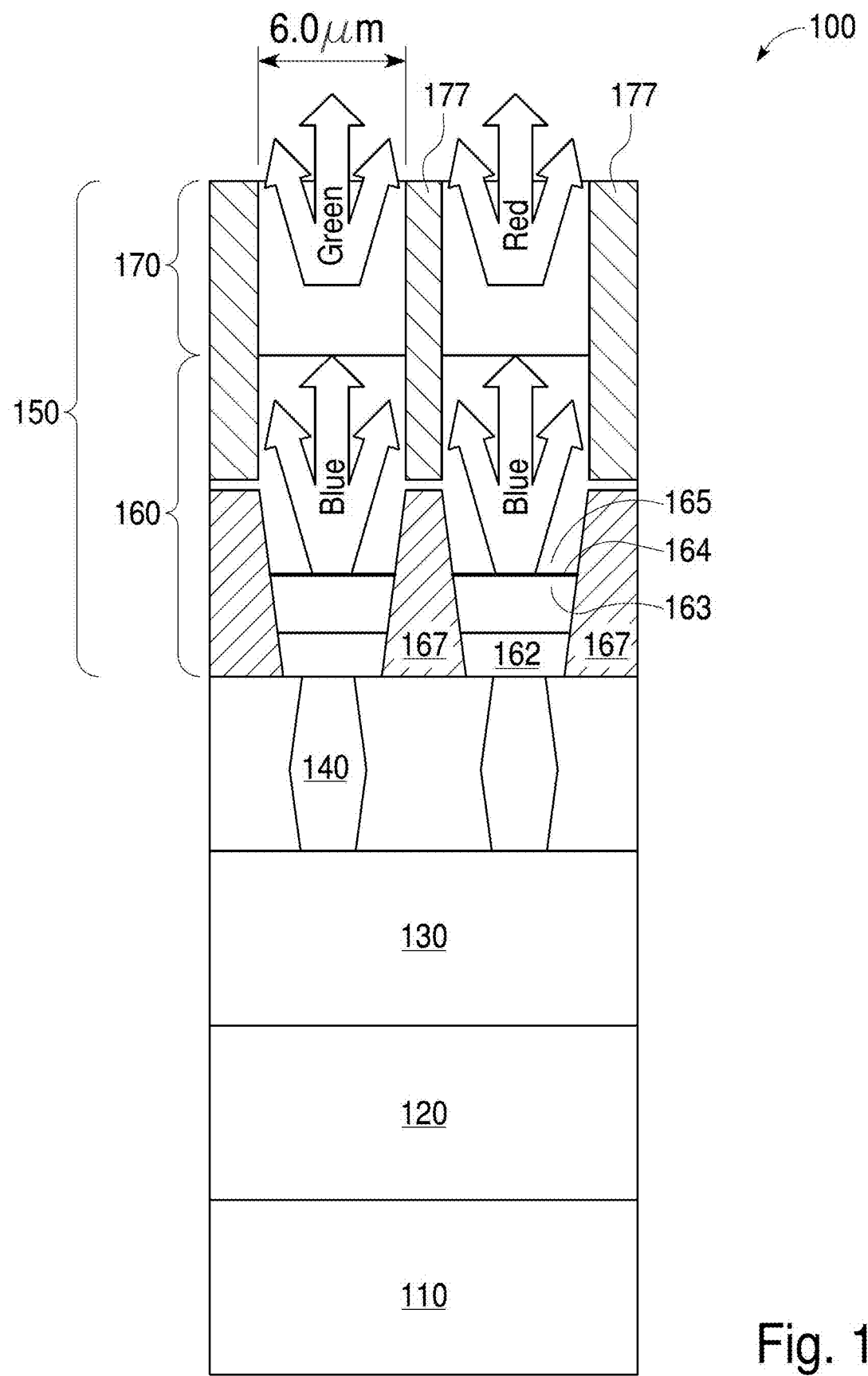
FIG. 1A is a cross-sectional diagram of a smart pixel.

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

The traditional approach for LED-based displays uses a set of integrated circuits to convert the incoming digital image data into the analog drive signals required to correctly operate the LEDs in the array. For example, some integrated circuits may perform color correction, brightness correction, temperature compensation and/or correction for aging. All of these functions may be aided by calibration data that characterizes the response of a specific device. Once the image data has been processed to account for device-specific characteristics, another integrated circuit with driver circuits may be used to convert these adjusted values into the drive signals required to operate the LEDs.

This approach based on a chip set of integrated circuits has disadvantages for certain applications. For example, it requires the design and manufacture of the separate chips in a chip set. In addition, these chips will have to be placed somewhere in the final display product. If they are placed around the periphery of the display, this adds to the width of the display border and prevents the production of truly borderless displays. If placed behind the LED elements of the display, this adds to the overall thickness of the product. The use of separate chips also requires interconnects between chips. This can be significant if there are a large number of pixels, a high video frame rate and/or a complicated pipeline.

One reason this approach has been used is because the LED array may be a single die of LEDs. In some cases, the driver circuits may also be fabricated on a single die and bonded to the die containing the LEDs. However, this itself can have disadvantages in certain applications. For example, if the display is large, then the LED die and the die with the driver circuits will also have to be large because they must be similar in size to the display. It can be difficult to manufacture such large die. Even if they could be easily manufactured, they will be unnecessarily expensive. The cost of a semiconductor die is roughly proportional to the area of the die. If the circuitry can fit into less than the actual area used, then the extra die area is unnecessary cost. In addition, semiconductor die are usually opaque. An opaque die that covers the entire area of the display will prevent the creation of see-through displays.

In certain embodiments described below, a display is created using "smart pixels." A smart pixel is a pixel of a display that integrates the pixel pipeline as part of the pixel, rather than using separate integrated circuits. A smart pixel may be based on an integrated stack that includes light emitting elements, an external data contact for receiving digital data for that pixel, and the pixel pipeline from the digital data to the light emitting elements.

For example, the integrated stack of the smart pixel may include gallium nitride (GaN) light emitting diodes (LEDs) that produce light for an individual color pixel of the display. The LEDs themselves may be different colors, or they may be used in conjunction with color conversion materials such as quantum dots. The stack also includes an external contact that receives digital data that represents the individual color pixel in a color space. For example, the smart pixel may receive RGB, YUV or other standardized representations of color pixels. The stack may also include memory and CMOS analog and digital circuits, which implement the pixel pipeline. The memory may store calibration data and the pixel pipeline may apply calibrations using this data to correct for color, brightness or adjust for temperature.

Figure 1B:
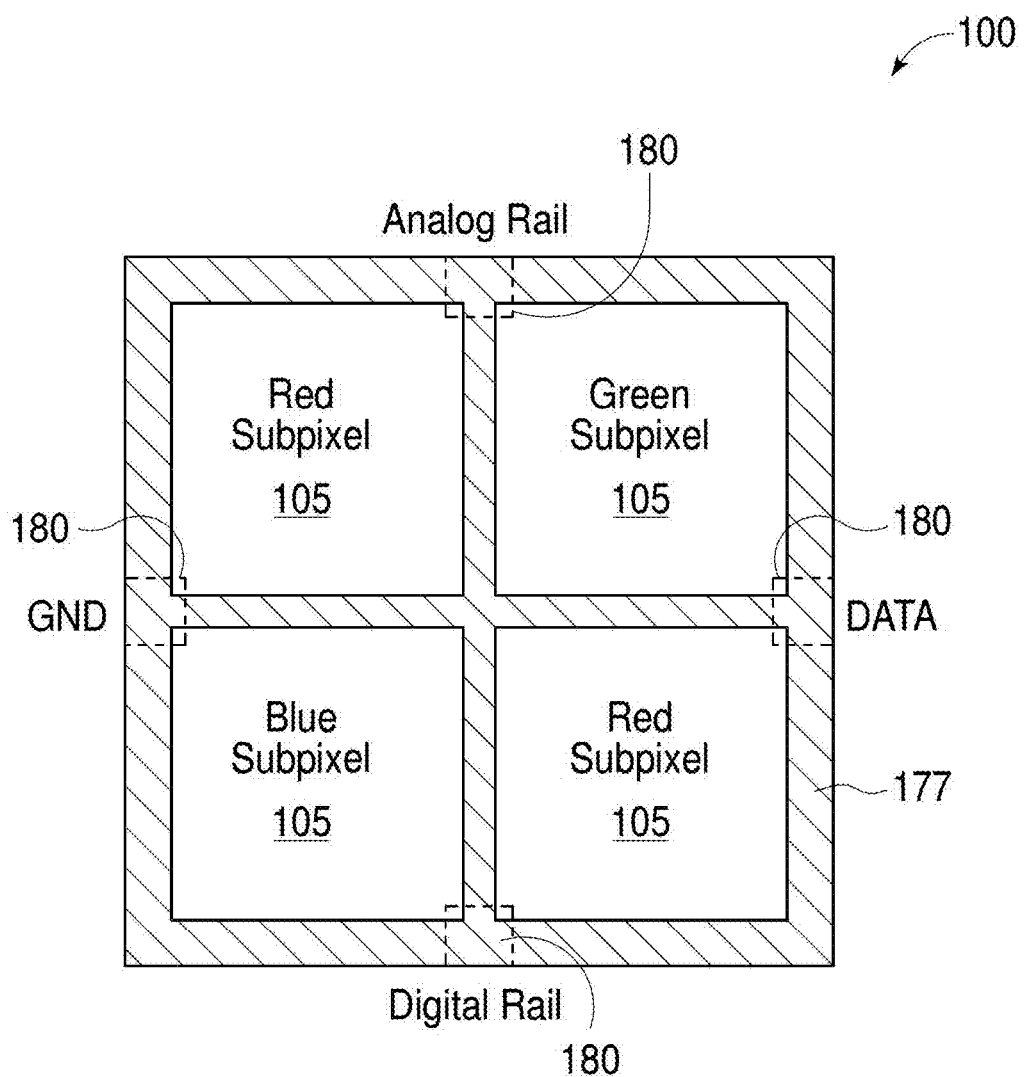
FIG. 1B is a top view of a smart pixel.

FIGS. 1A and 1B are a cross-sectional diagram and a top view of a smart pixel 100. In FIG. 1A, from bottom to top, the smart pixel includes a CMOS memory layer 110, a CMOS digital layer 120, a CMOS analog layer 130 and a light emitting layer 150 with bonding 140 in between. The smart pixel 100 receives digital data that represents the light to be displayed by the pixel. For example, the digital data may be in standard RGB or YUV color formats or express colors using standard color spaces such as the CIE color space. The smart pixel includes a pipeline (referred to as the pixel pipeline), which converts this digital data into drive signals for LEDs 160 in the light emitting layer 150.

The memory layer 110 may include SRAM cells that hold calibration data. This calibration data may be used to compensate for variations in device response, effects of device aging, temperature effects or to adjust the display based on ambient light levels. In some cases, pixels may be calibrated during manufacturing with the calibration data stored in SRAM so that no further calibration is required. Alternatively, calibration data may be loaded after manufacturing.

The digital layer 120 includes digital circuits that apply corrections to the incoming digital data according to the calibration data, for example. The analog layer 130 converts the digital signals to analog drive signals for the LEDs 160. In this example, the LEDs 160 are blue gallium nitride LEDs, and color conversion materials 170, such as quantum dots, are used to convert blue light to red or green for some of the LEDs. In alternate designs, the LEDs 160 may be different color LEDs. Additional components, such as optical wedges or lenses, may be added to the stack to shape the outgoing light.

In this example, the footprint of the integrated stack is determined by the LEDs 160. The CMOS layers 110, 120, 130 are not significantly larger in area than the LEDs. This reduces the cost of the CMOS layers compared to larger area layers. It also reduces the amount of light blocked by the opaque CMOS layers for transparent displays. The LEDs 160 preferably are densely packed also to reduce the area footprint. For example, the LEDs within one pixel may be separated by not more than 500 nm.

The LEDs 160 in this example include a bottom reflector 162 which is also one contact to the LED, a p-doped GaN layer 163, an active region 164 and an n-doped GaN layer 165. The common contact to the LEDs may be provided by a contact to the n-doped GaN. Individual LEDs 160 are separated by isolation regions 167 and 177, including between the color conversion materials 170. Isolation regions 167 and 177 can provide electrical isolation (e.g. dielectric material), optical isolation (e.g., reflective layer) or both (e.g., insulator coated with reflective metal). Region 177 may be aluminum or other metal, thus providing both optical isolation between the LEDs and a common contact to the n-doped GaN layer. The bottom reflector 162, which is also the bottom contact for the LEDs, is bonded 140 to the CMOS analog die 130. In this example, the layers 110, 120, 130, 160 are fabricated on separate die and then bonded together, creating a vertical, integrated stack. Because the integrated stack includes a pixel pipeline that implements calibration corrections, the pixel may be operated with contacts only for power and digital data.

FIG. 1B is a top view of the smart pixel. The pixel 100 includes four subpixels 105 of different colors: two red, one blue and one green. The red and green subpixels use color conversions materials, as shown in FIG. 1A. The blue subpixel uses the blue LED without color conversion. FIG. 1B also shows the optical isolation 177 between subpixels. Four external contacts 180 are shown in FIG. 1B: one for the digital data (DATA), one for power to the analog circuits (Analog rail), one for power to the digital circuits (Digital rail) and one for ground (GND). In this example, the external contact DATA 180 is the only external signal contact for the pixel pipeline. The external contracts 180 are located on the sides of the integrated stack, so they are shown as dashed lines in FIG. 1B because they are not directly visible from a top view.

Figure 2:
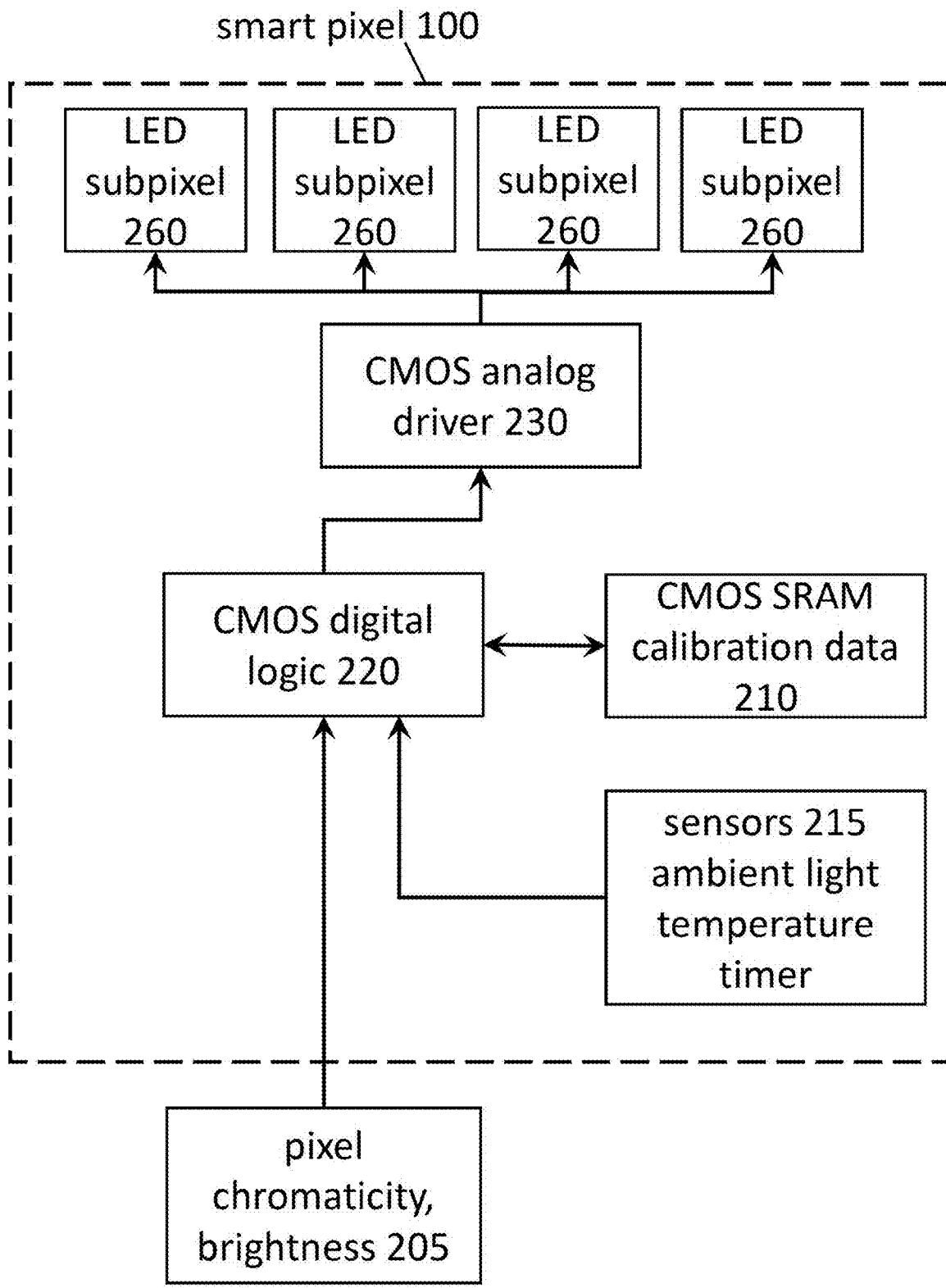
FIG. 2 is a block diagram of a pixel pipeline.

FIG. 2 is a block diagram of a pixel pipeline contained within a smart pixel 100. The digital data 205 is an input to the pixel pipeline. For example, the digital data 205 may include chromaticity and brightness values for the pixel. These values are processed by CMOS digital logic 220. The digital logic may make calibration corrections, or adjustments for other factors, such as ambient light, temperature or aging. Color calibration, color gamut correction, brightness correction, and temperature compensation are some examples of functions that may be performed by digital logic 220. Calibration data 210 may be stored in the SRAM within the smart pixel. The smart pixel may also include other data sources 215, such as sensors or timers. This data may also be generated outside the smart pixel and then transferred to the smart pixel along with the color information 205. In one approach, the smart pixels are connected to a data bus and data is transmitted to the pixels via the data bus. The corrected digital signals are then converted to LED drive signals by the CMOS analog driver 230. These drive the individual LEDs 260

Figure 3A:
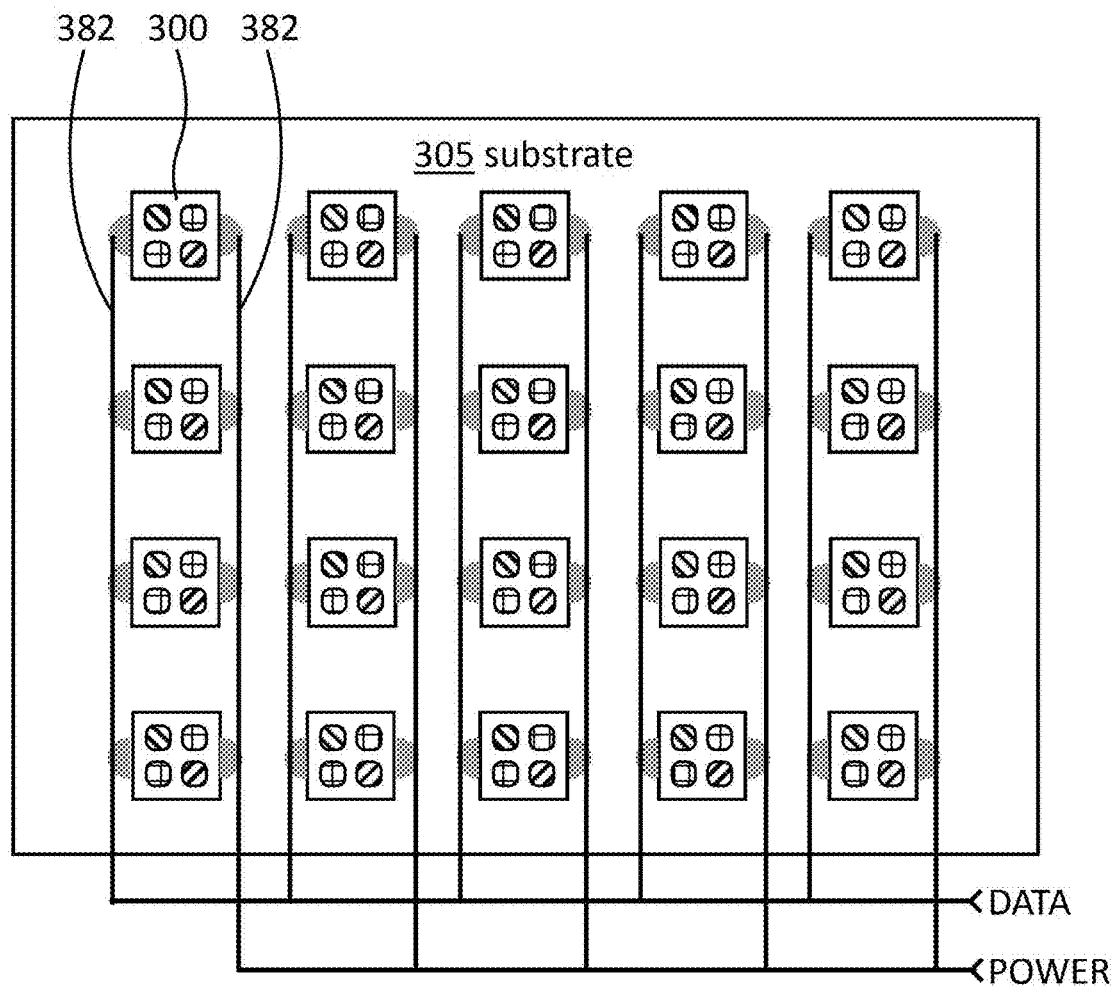
FIG. 3A is a plan view of the arrangement of smart pixels on a display.

FIG. 3A is a plan view of the arrangement of smart pixels on a display. The display includes a substrate 305 and the smart pixels 300 are arranged on the substrate to form color pixels of the display. Substrates may include transparent materials such as glass or plastic. They may also include flexible materials such as cloth. In this example, the smart pixels 300 are 20 um square. They are arranged in a rectangular array with a 600 um pitch. If the substrate is transparent, then there will be significant clear space between pixels so that the display will be see-through.

Figure 3B:
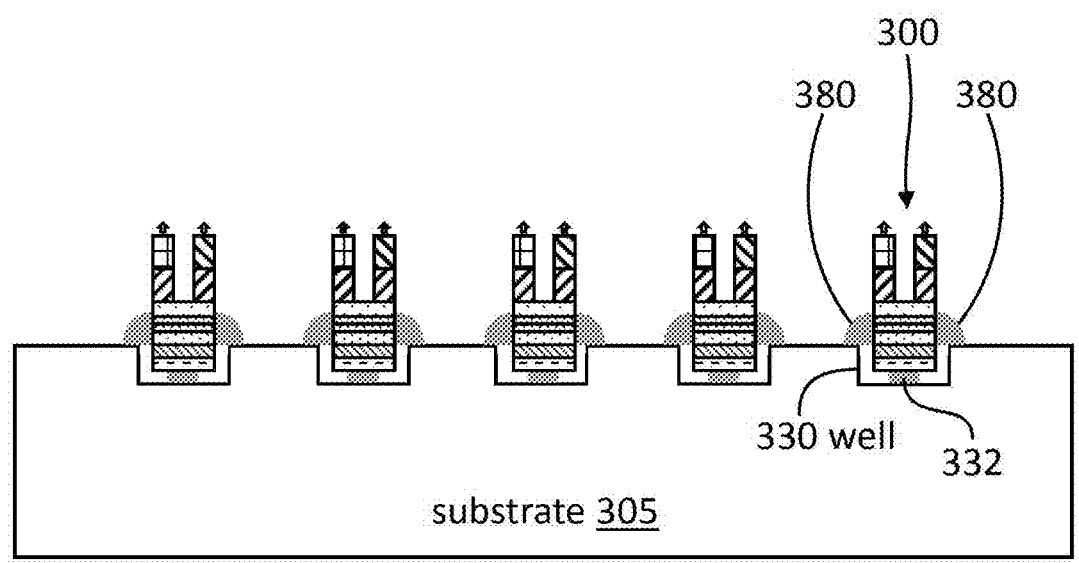
FIG. 3B is a cross-sectional diagram of a smart pixel on a substrate.

FIG. 3B is a cross-sectional diagram of smart pixels 300 on a substrate 305. In this example, the substrate 305 has depressions 330. The smart pixels 300 are seated in these wells 330 and attached by epoxy 332. This smart pixel is taller than it is wide: 75 um tall and 20 um wide in this example. FIG. 3B also shows electrical contacts 380 on the side of the integrated stack. These contacts 380 are connected to metal interconnects 382 on the substrate, as shown in FIG. 3A. The plan view of FIG. 3A shows interconnects 382 connecting to the left and right sides of the array of smart pixels, providing DATA and POWER to the pixels. Additional interconnects may be used to provide other signals.

Figure 4A:
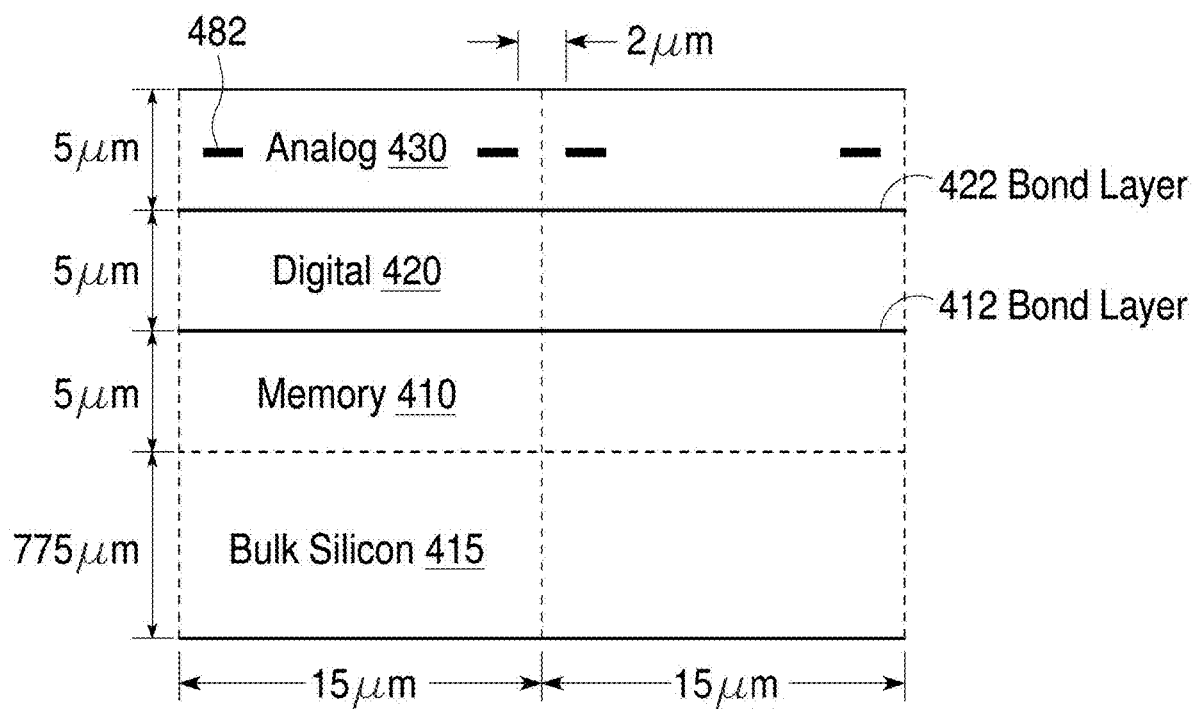
FIGS. 4A-4E are cross-sectional diagrams and plan views illustrating a process for fabricating smart pixels.
Figure 4A:
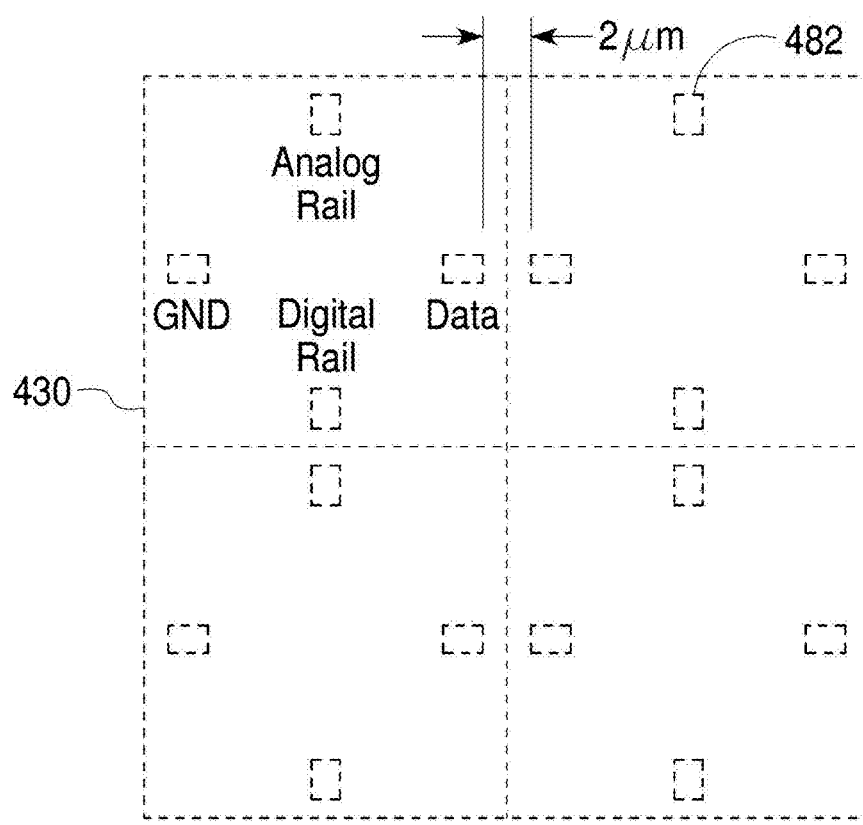

FIGS. 4A-4E are cross-sectional diagrams and plan views illustrating a process for fabricating smart pixels using wafer-level processes. The top part of each of these figures shows a cross-sectional diagram of two adjacent pixels from the wafer, and the bottom part shows a plan view of a 2×2 section of pixels. In this example, each pixel has an area of 15 um square. The cross-sectional view of FIG. 4A shows three CMOS wafers bonded to each other: the CMOS analog layer 430, the CMOS digital layer 420 and the CMOS memory layer 410. In this structure, the analog and digital layers 430 and 420 have been thinned to 5um thickness. The memory layer 410 includes some bulk silicon 415. In one approach, the analog wafer 430 and digital wafer 420 are bonded to each other by bonding layer 422. The digital wafer 420 may then be thinned to 5um. This combination is then bonded to the memory wafer 410 by bonding layer 412. The analog wafer 430 may then be thinned and planarized.

The analog layer 430 includes electrical contacts 482 which eventually will connect to the side contacts. These electrical contacts 482 may provide signals to the other layers by routing through the layers. Alternatively, electrical contacts may be provided at the different layers. The contacts 482 from adjacent pixels are separated by a small distance: 2 um in this example. The plan view shows the top surface of the analog layer 430. For illustration, the electrical contacts 482 are also shown.

Figure 4B:
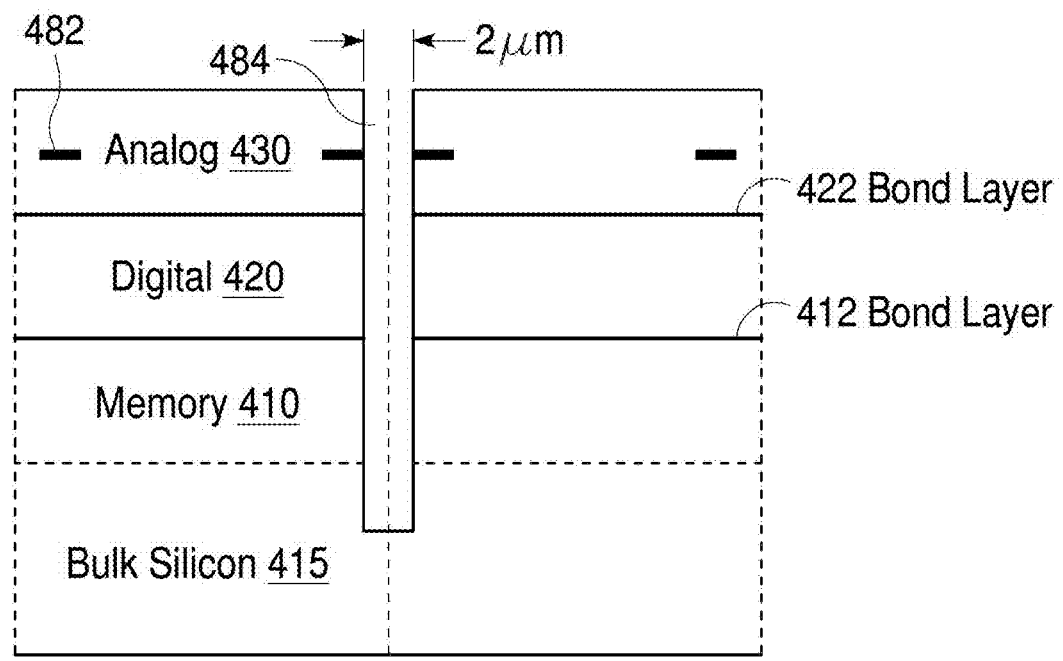
Figure 4B:
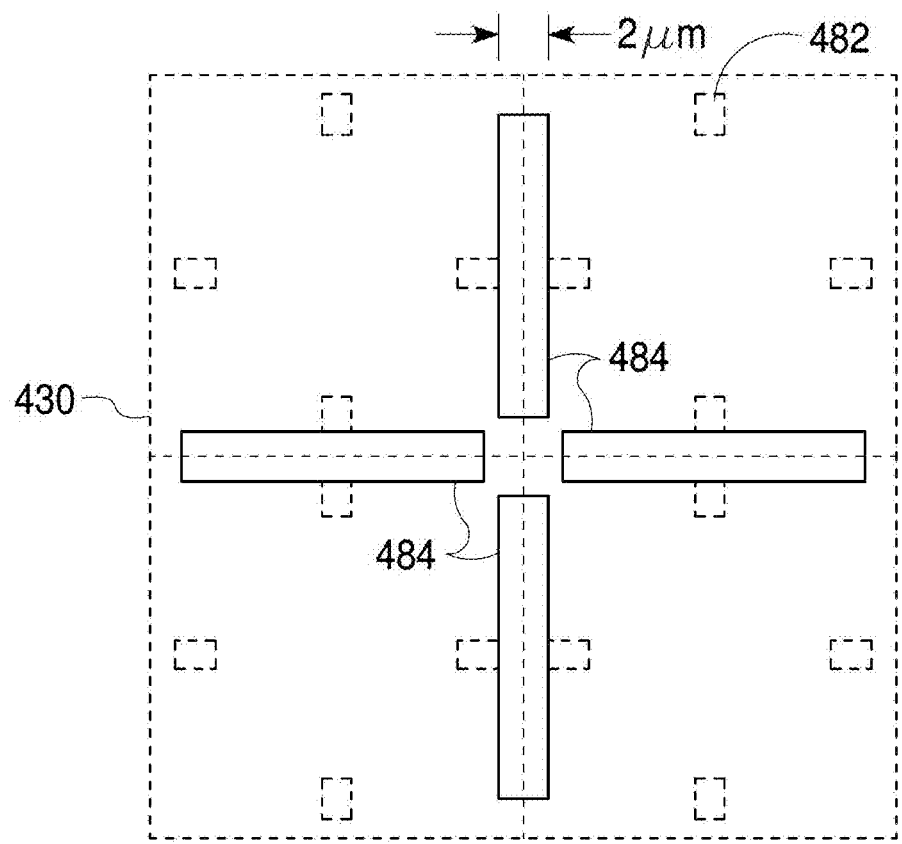
Figure 4C:
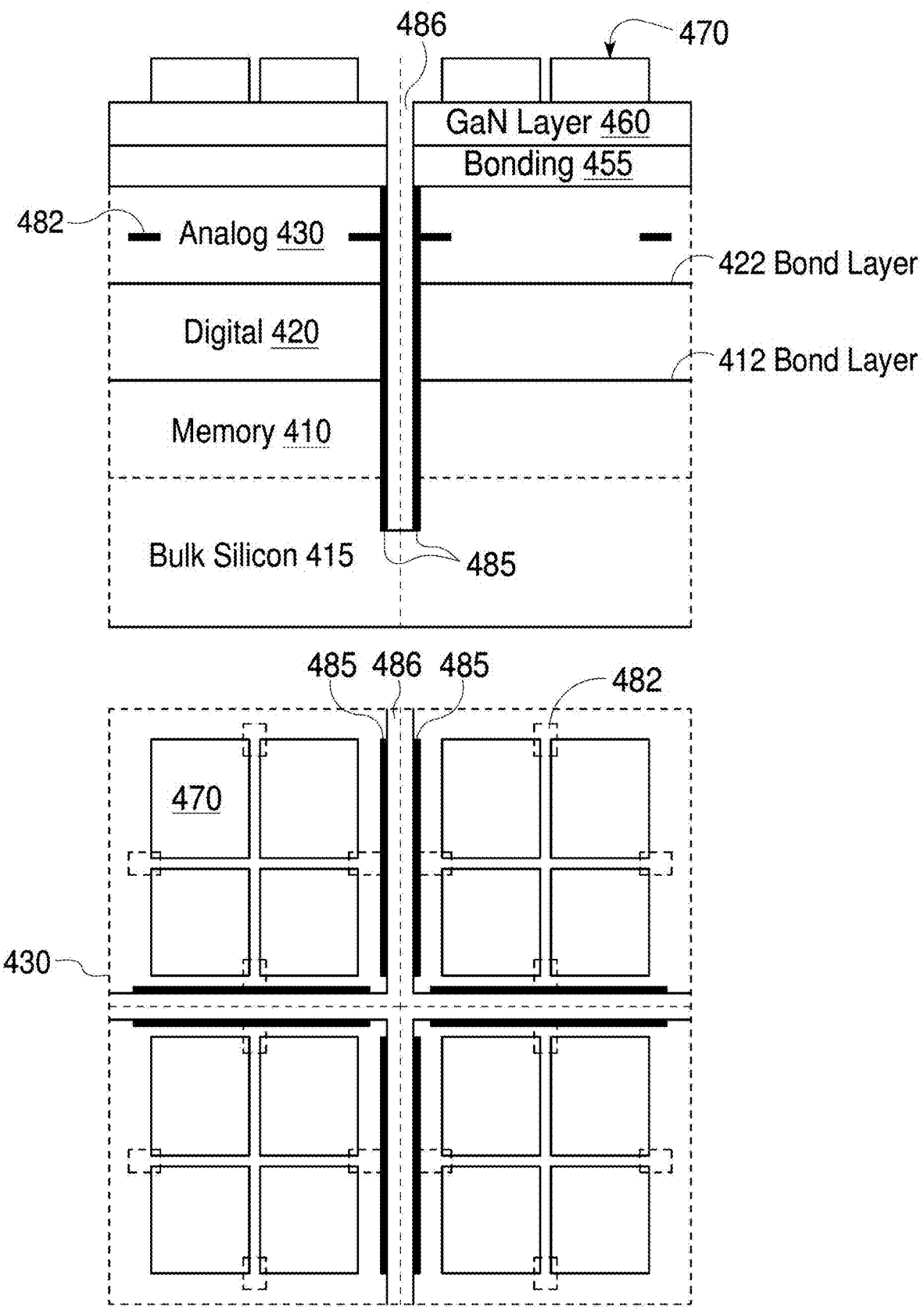
Figure 4D:
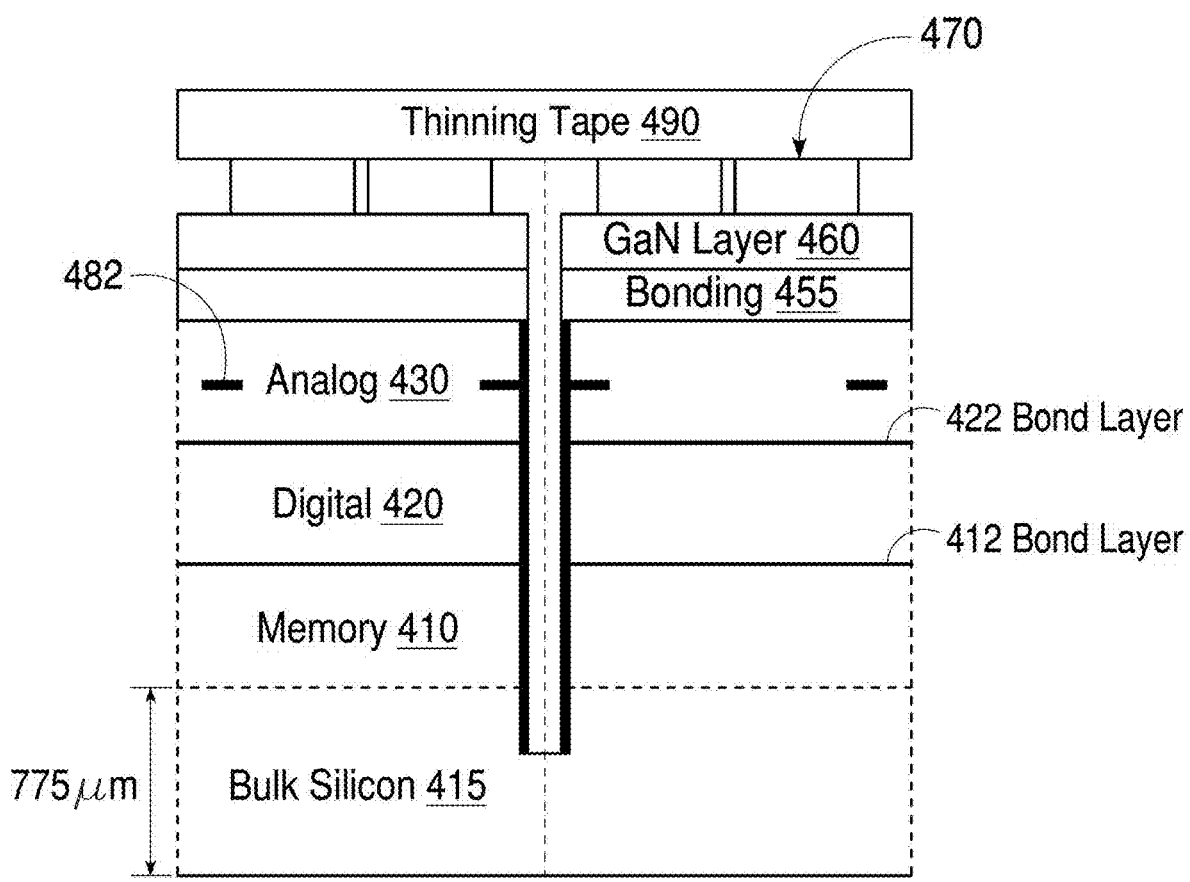

In FIG. 4B, a deep silicon etch creates trenches 484, which expose the electrical contacts 482. In FIGS. 4B-4D, only the processing between pixels is shown. For example, trenches 484 will also exist on the edges of the views of FIG. 4B, but these are not shown for clarity. In some cases, the contacts 482 may be built up before etching. For example, if the contacts 482 are copper, they may be extended in the vertical direction by creating copper vias to the contacts. The trenches 484 will then expose both the contact 482 and the copper via.

Metal 485, as shown in FIG. 4C, is then deposited into the trenches 484. In FIG. 4C, the GaN LED wafer is bonded to the device stack. FIG. 4C shows the LED layer 460 and the color conversion materials for individual subpixels 470. A deep trench 486 is etched into the metal 485, splitting each metal fill into two pieces. Each piece 485 acts as a side contact for one of the two adjacent pixels.

Figure 4E:
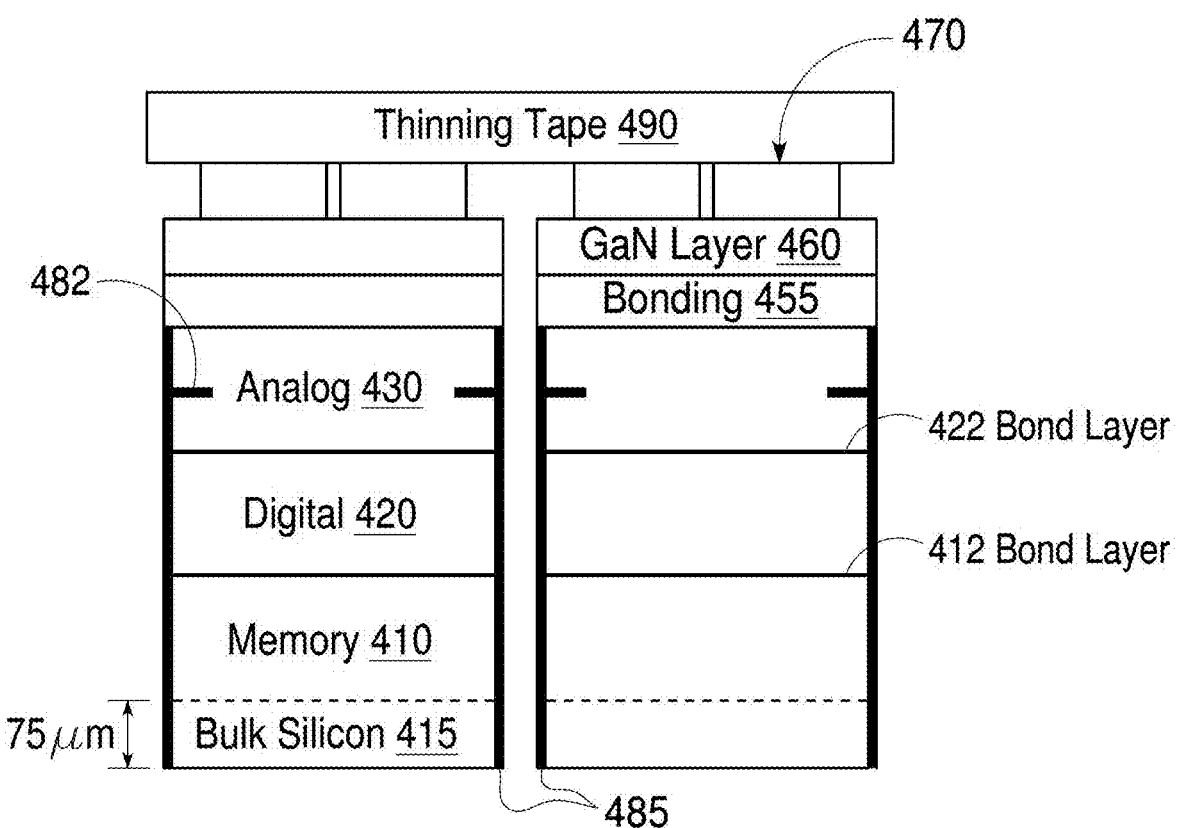

In FIG. 4D, a thinning tape 490 is attached to the LED side of the integrated stack. Other types of support may be used. In FIG. 4E, the stack is thinned from the CMOS side. When the thinning reaches the trenches 486, this will singulate the wafer into individual smart pixels, as shown in FIG. 4E. Unlike the previous figures, FIG. 4E also shows the structure on the edges of the pixels, in addition to the structure between adjacent pixels.

In the example of FIGS. 4A-4E, the different CMOS functions are provided by different layers (wafers) 410, 420, 430. Alternatively, the CMOS functions may be fabricated in a single silicon wafer, which is then bonded to the substrate containing the LEDs.

Figure 5A:
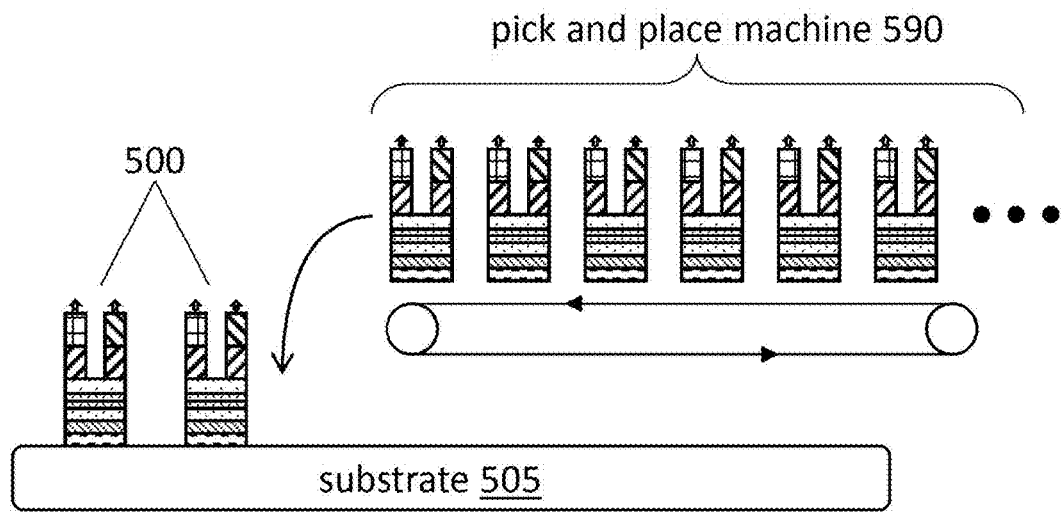
FIG. 5A illustrates smart pixel placement on an arbitrary substrate.

FIG. 5A illustrates the placement of smart pixels 500 on an arbitrary substrate 505. In this example, the substrate need only supply power and data to each pixel. No memory or external logic is required. The data may include pixel address data. A pick and place machine 590 picks the individual smart pixels from the tape of FIG. 4 and places each smart pixel at the correct location on the substrate 505. The small pixels may be spaced apart from each other for large displays.

Figure 5B:
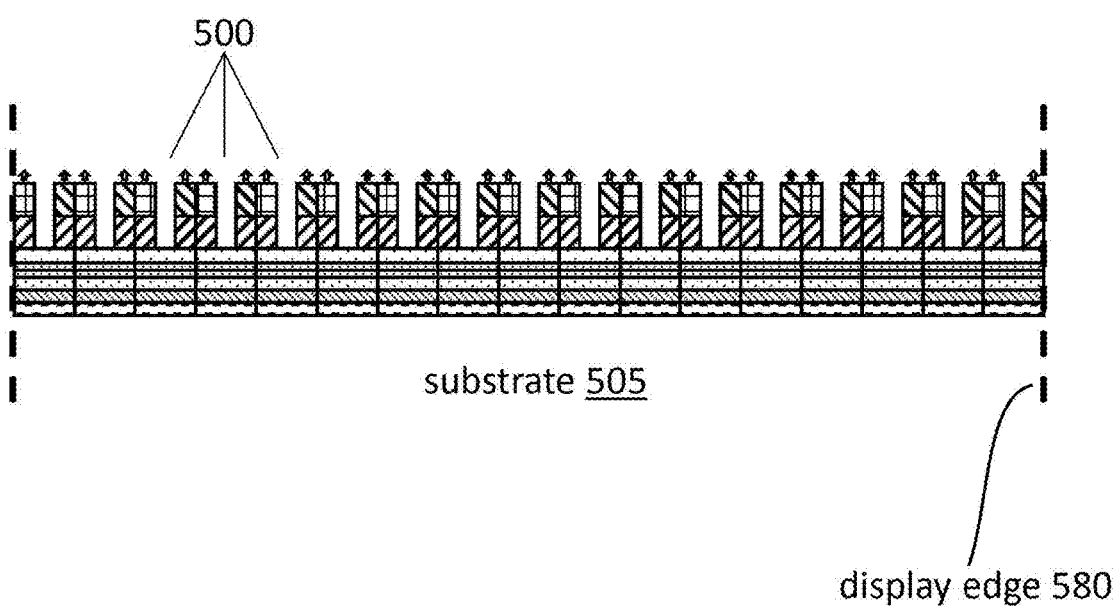
FIG. 5B illustrates a display with border that does not extend past the pixels.

In an alternative scenario, smart pixels 500 need not be separated from one another after wafer fabrication. An array of smart pixels that is not diced may form a display that is borderless. For example, FIG. 5B illustrates a display where the edge 580 of the display does not extend past the pixel boundary. Conventional displays are often surrounded by extra die area devoted to memory and other backplane functions. A borderless display does not need that extra area as light emitting, color conversion, CMOS analog, CMOS digital and memory circuits may be stacked in the direction normal to the surface of each wafer involved.

Although the detailed description contains many specifics, these should not be construed as limiting the scope of the invention but merely as illustrating different examples. It should be appreciated that the scope of the disclosure includes other embodiments not discussed in detail above. Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

What is claimed is:

1. A display comprising: a substrate; and
   a plurality of devices arranged on the substrate to form color pixels of the display, each device comprising an integrated stack with:
   at least two gallium nitride (GaN) light emitting diodes (LEDs) that produce light for an individual color pixel of the display;
   an external data contact for receiving digital data that represents the individual color pixel in a color space; and
   a pixel pipeline between the external data contact and the gallium nitride (GaN) LEDs, the pixel pipeline converting the digital data into drive signals for the gallium nitride (GaN) LEDs.

2. The display of claim 1 wherein the external data contact is the only external signal contact for the pixel pipeline.

3. The display of claim 2 wherein the individual color pixel comprises at least two subpixels of different colors.

4. The display of claim 2 wherein the digital data is in a standardized color format.

5. The display of claim 1 wherein each device is connected to a data bus.

6. The display of claim 1 wherein the external data contact is located on a side of the integrated stack.

7. The display of claim 1 wherein the LEDs are different color LEDs.

8. The display of claim 1 wherein the LEDs are same color LEDs, and the integrated stack further comprises color conversion material to convert light from at least one of the LEDs to a different color.

9. The display of claim 1 wherein the substrate has depressions, and the devices are located in the depressions.

10. The display of claim 1 wherein the substrate is flexible.

11. The display of claim 1 wherein the substrate is transparent, and the devices occupy less than 25% of an area of the substrate.

12. The display of claim 1 wherein the substrate is borderless around the devices.

13. A display comprising: a substrate; and
    a plurality of devices arranged on the substrate to form pixels of the display, each device comprising an integrated stack containing:
    at least two gallium nitride (GaN) light emitting elements for a set of one or more pixels of the display;
    an external data contact for receiving digital data representing the set of pixels; and
    a set of one or more pixel pipelines between the external data contact and the gallium nitride (GaN) light emitting elements, the pixel pipeline converting the digital data into drive signals for the gallium nitride (GaN) light emitting elements.

14. A device for displaying a color pixel of a display, the device including an integrated stack comprising:
- at least two gallium nitride (GaN) light emitting diodes (LEDs) that produce light for an individual color pixel of the display;
- an external data contact for receiving digital data that represents the individual color pixel in a color space; and
- a pixel pipeline between the external data contact and the gallium nitride (GaN) LEDs, the pixel pipeline converting the digital data into drive signals for the gallium nitride (GaN) LEDs.

15. The device of claim 14 wherein the integrated stack further comprises:
- a memory that stores calibration data for the device, wherein the pixel pipeline applies the calibration data in producing the drive signals.

16. The device of claim 15 wherein the calibration data includes color calibration data, and the pixel pipeline converts the received digital data to the drive signals according to the color calibration data.

17. The device of claim 15 wherein the calibration data includes brightness calibration data, and the pixel pipeline converts the received digital data to the drive signals according to the brightness calibration data.

18. The device of claim 15 wherein the calibration data includes temperature calibration data, and the pixel pipeline converts the received digital data to the drive signals according to the temperature calibration data.

19. The device of claim 14 wherein the pixel pipeline in the integrated stack comprises CMOS analog circuits, CMOS digital circuits and memory.

20. The device of claim 14 wherein the integrated stack further comprises:
- isolation between the LEDs.

21. The device of claim 14 wherein a base of the integrated stack has an area not larger than an area of the LEDs.

22. The device of claim 14 wherein a height of the integrated stack is greater than a width of the integrated stack.

23. The device of claim 14 wherein the LEDs are separated by not more than 500 nm.

* * * * *